United States Patent
Rizzuto

[11] Patent Number: 6,001,688
[45] Date of Patent: Dec. 14, 1999

[54] METHOD OF ELIMINATING POLY STRINGER IN A MEMORY DEVICE

[75] Inventor: Judith Quan Rizzuto, Los Gatos, Calif.

[73] Assignee: Advanced Micro Devices, Inc., Sunnyvale, Calif.

[21] Appl. No.: 08/986,860

[22] Filed: Dec. 8, 1997

[51] Int. Cl.[6] .................................................. H01L 21/336
[52] U.S. Cl. ...................... 438/264; 438/587; 438/593; 438/963
[58] Field of Search ..................................... 438/200, 253, 438/254, 257, 264, 453, 587, 588, 593, 595, 669, 963

[56] References Cited

U.S. PATENT DOCUMENTS

| | | | |
|---|---|---|---|
| 4,981,810 | 1/1991 | Fazan et al. .............................. | 438/495 |
| 5,126,808 | 6/1992 | Montalvo et al. ....................... | 257/316 |
| 5,324,683 | 6/1994 | Fitch et al. .............................. | 438/422 |
| 5,342,801 | 8/1994 | Perry et al. ............................. | 438/588 |
| 5,378,648 | 1/1995 | Lin et al. ................................ | 438/963 |
| 5,427,967 | 6/1995 | Sadjadi et al. .......................... | 438/257 |
| 5,574,685 | 11/1996 | Hsu ......................................... | 257/316 |
| 5,598,369 | 1/1997 | Chen et al. ........................... | 365/185.3 |
| 5,639,681 | 6/1997 | Carmody et al. ....................... | 438/669 |
| 5,654,219 | 8/1997 | Huber ...................................... | 438/593 |
| 5,661,055 | 8/1997 | Hsu et al. ................................ | 438/453 |
| 5,668,034 | 9/1997 | Sery et al. ............................... | 438/286 |
| 5,670,018 | 9/1997 | Eckstein et al. ........................ | 438/963 |
| 5,718,800 | 2/1998 | Juengling ................................ | 438/200 |

OTHER PUBLICATIONS

*Solid State Technology*, Plasma Technology, "High–density plasma CVD and CMP for 0.25–$\mu$m intermetal dielectric processing", J. T. Pye, H. W. Fry, and W. J. Schaffer, Dec., 1995, pp. 65–71.

*Solid State Technology*, Deposition, "Interconnect metallization for future device generations", Bruce Roberts, Alain Harrus and Robert L. Jackson, Feb., 1995, pp. 69–78.

*Solid State Technology*, A Four–Metal Layer, High Performance Interconnect System for Bipolar and BiCMOS Circuits, Syd R. Wilson, John L. Freeman, Jr., and Clarence J. Tracy, Nov., 1991, pp. 67–71.

*Primary Examiner*—Charles Bowers
*Assistant Examiner*—Jack Chen
*Attorney, Agent, or Firm*—Amin & Eschweiler, L.L.P

[57] ABSTRACT

A method (200) of making a flash memory device without poly stringers includes forming a stacked gate region (202) on a substrate (102) and forming one or more word lines (122a, 122b, 204) in the stacked gate region. The method further includes performing a self-aligned etch (206) in regions adjacent to the one or more word lines (122a, 122b) and subsequently performing an isotropic etch (208) to remove any poly stringers (128) in the regions adjacent the one or more word lines (122a, 122b).

17 Claims, 8 Drawing Sheets

METHOD OF ELIMINATING POLY STRINGER IN A MEMORY DEVICE

FIELD OF THE INVENTION

The present invention generally relates to integrated circuits and, in particular. to a method of flash memory fabrication which improves memory cell reliability and manufacturability by removing poly stringers caused by ONO (oxide-nitride-oxide) fencing.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one MxN array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

Figure 2:
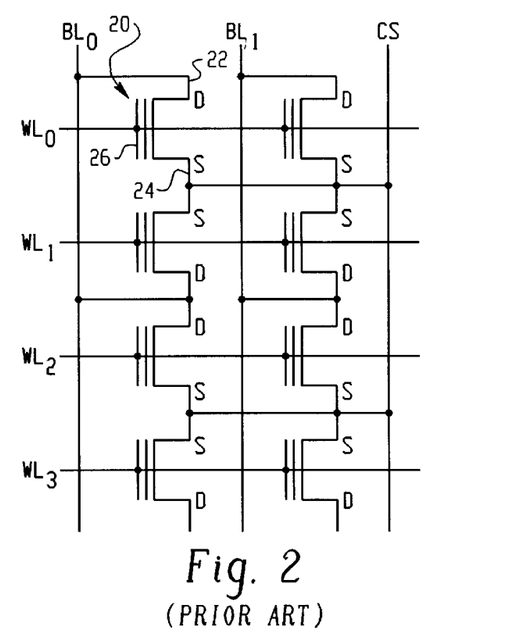
FIG. 2 is a schematic diagram illustrating a prior art core portion of a flash memory circuit.

The memory cells within the core portion 12 are coupled together in a circuit configuration, such as the configuration illustrated in prior art FIG. 2. Each memory cell 20 has a drain 22, a source 24 and a stacked gate 26. Each stacked gate 26 is coupled to a word line (WL0, WL1, . . . , WLn) while each drain 22 is coupled to a bit line (BL0, BL1, . . . , BLn). Lastly, each source 24 is coupled to a common source line CS. Using peripheral decoder and control circuitry, each memory cell 20 can be addressed for programming, reading or erasing functions.

Figure 1:
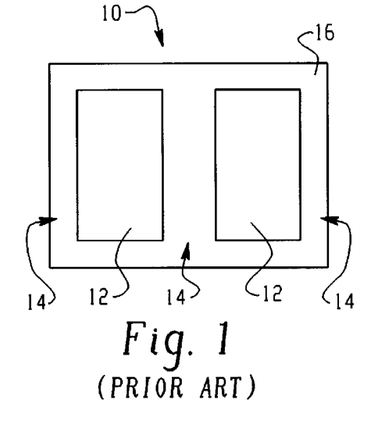
FIG. 1 is a plan view schematically illustrating a prior art layout of a flash memory chip.
Figure 3:
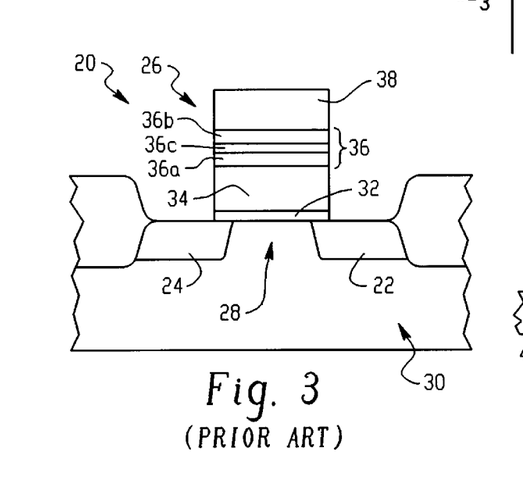
FIG. 3 is a fragmentary cross section illustrating a prior art stacked gate flash memory cell.

Prior art FIG. 3 represents a fragmentary cross section diagram of a typical cell 20 in the core region 12 of prior art FIGS. 1 and 2. Such a cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The stacked gate 26 also includes a polysilicon floating gate 34 which overlies the tunnel oxide 32 and an interpoly dielectric layer 36 which overlies the floating gate 34. The interpoly dielectric layer 36 is often a multilayer insulator such as an oxide-nitride-oxide (ONO) layer having two oxide layers 36a and 36b sandwiching a nitride layer 36c. Lastly, a polysilicon control gate 38 overlies the interpoly dielectric layer 36. The control gates 38 of the respective cells 20 that are formed in a lateral row share a common word line (WL) associated with the row of cells (see, e.g., prior art FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

According to conventional operation, the flash memory cell 20 operates in the following manner. The cell 20 is programmed by applying a relatively high voltage $V_G$ (e.g., approximately 12 volts) to the control gate 38 and a moderately high voltage $V_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 34 since the floating gate 34 is surrounded by insulators (the interpoly dielectric 36 and the tunnel oxide 32). As a result of the trapped electrons, the threshold voltage of the cell 20 increases by about 3 to 5 volts. This change in the threshold voltage (and thereby the channel conductance) of the cell 20 created by the trapped electrons is what causes the cell to be programmed.

To read the memory cell 20, a predetermined voltage $V_G$ that is greater than the threshold voltage of an unprogrammed cell, but less than the threshold voltage of a programmed cell, is applied to the control gate 38. If the cell 20 conducts, then the cell 20 has not been programmed (the cell 20 is therefore at a first logic state, e.g., a zero "0"). Likewise, if the cell 20 does not conduct, then the cell 20 has been programmed (the cell 20 is therefore at a second logic state, e.g., a one "1"). Consequently, one can read each cell 20 to determine whether it has been programmed (and therefore identify its logic state).

In order to erase the flash memory cell 20, a relatively high voltage $V_S$ (e.g., approximately 12 volts) is applied to the source 24 and the control gate 38 is held at a ground potential ($V_G=0$), while the drain 24 is allowed to float. Under these conditions, a strong electric field is developed across the tunnel oxide 32 between the floating gate 34 and the source region 22. The electrons that are trapped in the floating gate 34 flow toward and cluster at the portion of the floating gate 34 overlying the source region 22 and are extracted from the floating gate 34 and into the source region 22 by way of Fowler-Nordheim tunneling through the tunnel oxide 32. Consequently, as the electrons are removed from the floating gate 34, the cell 20 is erased.

During the processing of the core portion 12 having a circuit configuration as illustrated in prior art FIG. 2 and a structure as illustrated in prior art FIG. 3, a problem often occurs involving poly stringers. The manner in which poly stringers are formed is illustrated in conjunction with prior art FIGS. 4a–7. Poly stringers result from (among other things) imperfect anisotropic etching of the floating polysilicon gate 34 (when delineating memory cells 20 along a given word line) and the subsequent shielding of some polysilicon material by an ONO "fence."

Figure 4A:
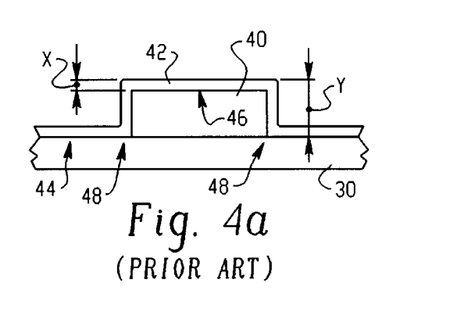
FIG. 4a is a fragmentary cross section illustrating a prior art polysilicon gate covered by an ONO layer.
Figure 4B:
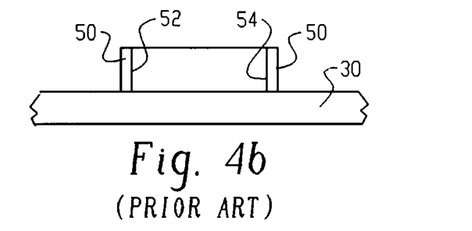
FIG. 4b is a fragmentary cross section illustrating a prior art polysilicon gate and an etched ONO layer forming an ONO fence.
Figure 4C:
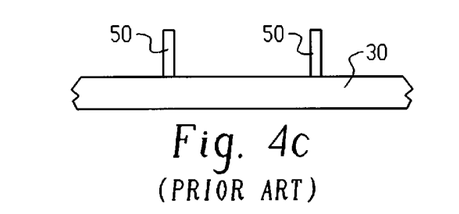
FIG. 4c is a fragmentary cross section illustrating a prior art etched polysilicon region having a remaining ONO fence.

An ideally anisotropically etched polysilicon gate 40 is illustrated in prior art FIG. 4a with an oxide-nitride-oxide (ONO) layer 42 overlying the gate 40. Note that at regions 44 and 46 the ONO layer 42 exhibits a film thickness "X" while at a region 48 (along the sidewalls of the gate 40) the ONO layer 42 exhibits a film thickness "Y", wherein X<<Y. Consequently, as illustrated in prior art FIG. 4b, when the ONO layer 42 is subsequently etched, removing a film thickness of X, an ONO fence 50 is left along the sidewalls 52 and 54 of the polysilicon gate 40. Subsequently, when portions of the polysilicon gate 40 are again etched to define the various words lines for the memory device, the ONO fence 50 remains, as illustrated in prior art FIG. 4c.

Figures 5, 6A, 6B, 6C, 7:
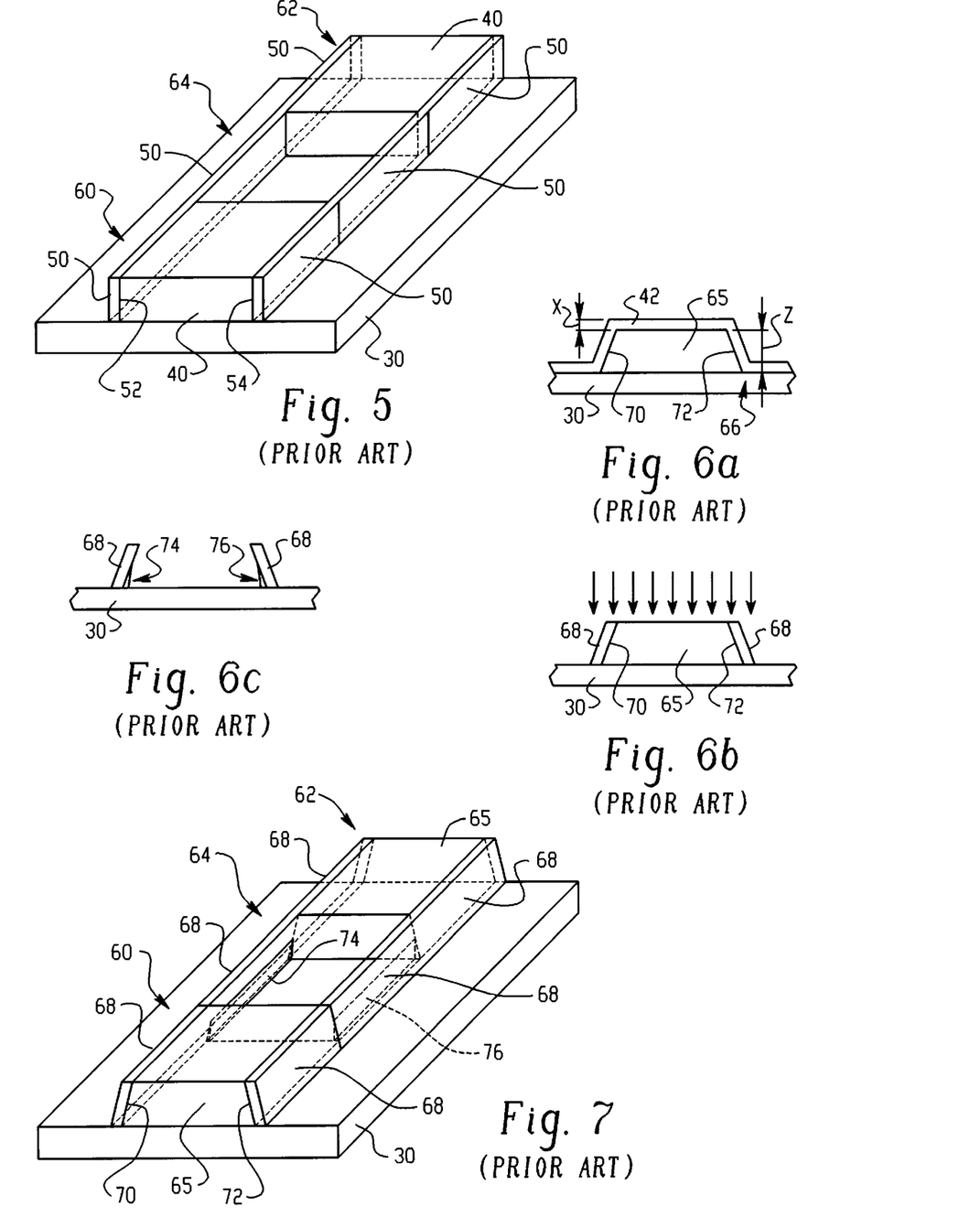
FIG. 5 is a perspective view of a prior art polysilicon gate region that has been etched to form separate word lines, wherein an ONO fence spans a region between the word lines.
FIG. 6a is a fragmentary cross section illustrating a prior art polysilicon gate having a non-ideal anisotropically etched profile covered by an ONO layer.
FIG. 6b is a fragmentary cross section illustrating a prior art polysilicon gate and an etched ONO layer forming an angled ONO fence.
FIG. 6c is a fragmentary cross section illustrating a prior art etched polysilicon region having a remaining angled ONO fence and poly stringers.
FIG. 7 is a perspective view of a prior art polysilicon gate region that has been etched to form separate word lines, wherein an angled ONO fence and poly stringers span a region between the word lines, thereby shorting the word lines together.

The manner in which the ONO fence 50 remains after the second etching of the polysilicon gate 40 may best be understood in its macroscopic context, as illustrated in prior art FIG. 5. In FIG. 5, the polysilicon gate 40 rests on the substrate 30 (actually, it rests on a thin tunnel oxide which, although not shown for simplicity, overlies the substrate 30). The ONO fence 50 remains along the sidewalls 52 and 54 in the regions 60 and 62 where a first word line (WL1) and a second word line (WL2) are formed in a manner similar to prior art FIG. 4b. (Note that the additional layers that make up the stacked gate structure 26 are not shown in prior art FIG. 5 for the sake of simplicity.) In an etched region 64, which delineates the regions 60 and 62 (and consequently the word lines WL1 and WL2) the ONO fence 50 also remains in a manner similar to prior art FIG. 4c.

As long as the initial etching of the polysilicon gate 40 (which delineates cells 20 along a single word line) occurs in an ideally anisotropic manner, as illustrated in prior art FIGS. 4a–4c and FIG. 5, no poly stringers are formed during the second etching of the gate 40 (which delineates separate word lines). It is well known, however, that anisotropic etch processes do not repeatably provide ideally anisotropic profiles. Instead, most anisotropic etch processes provide non-ideal profiles in the range of about 85–95° (wherein 90° is ideal). A non-ideal anisotropic etch profile 65 is illustrated in prior art FIG. 6a. When the ONO layer 42 of FIG. 6a is etched, an angled ONO fence 68 is left on the sloped sidewalls 70 and 72 of the polysilicon gate 65 because the region 66 has a film thickness "Z" along the sidewalls 70 and 72 that is thicker than the film thickness "X". Consequently, the angled ONO fence 68 remains, as illustrated in prior art FIG. 6b.

When the polysilicon gate 65 is subsequently etched (in an anisotropic manner via, e.g., reactive ion etching (RIE)), as illustrated in prior art FIGS. 6b and 6c, the angled ONO fence 68 shields a portion of the polysilicon gate 65, resulting in remnants 74 and 76 of polysilicon, which are the poly stringers. Transposing the non-ideally anisotropic polysilicon gate 65 and the resulting poly stringers 74 and 76 of FIGS. 6a–6c into their macroscopic context (as illustrated in prior art FIG. 7), it is clear that the poly stringers 74 and 76 pose a substantial reliability problem since the poly stringers 74 and 76 in the etched region 64 can short out the word lines in regions 60 and 62, respectively. That is, instead of the etched region 64 electrically isolating the word lines in regions 60 and 62 from one another, the poly stringers 74 and 76 (which are conductive) span the etched region 64, shielded by the angled ONO fence 68 and cause the gates 65 in the regions 60 and 62 to be shorted together.

SUMMARY OF THE INVENTION

The present invention embodies a method of forming a flash memory device that eliminates problems associated with poly stringers. The method includes a poly stringer clean-up etch that removes the poly stringers after a self-aligned etch ("SAE") step which is used to define the separate word lines. The clean-up etch is isotropic and laterally etches the poly stringers that were previously shielded by the angled ONO fence during the SAE, thereby preventing short circuit conditions between word lines and improving the manufacturability of the process.

To the accomplishment of the foregoing and related ends, the invention comprises the features hereinafter fully described and particularly pointed out in the claim. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. An embodiment of the present invention includes a method of eliminating poly stringers that occur during the SAE which defines the separate word lines. After the SAE etches away the ONO layer (except for the ONO fence) and the first polysilicon layer (used to form the floating gates in the flash memory cells), the poly stringers remain under the angled ONO fence which spans the region between the word lines. An isotropic post SAE clean-up etch is then used to laterally etch away the poly stringers, thereby preventing short circuit conditions between word lines and improving the manufacturability of the process.

Figure 8A:
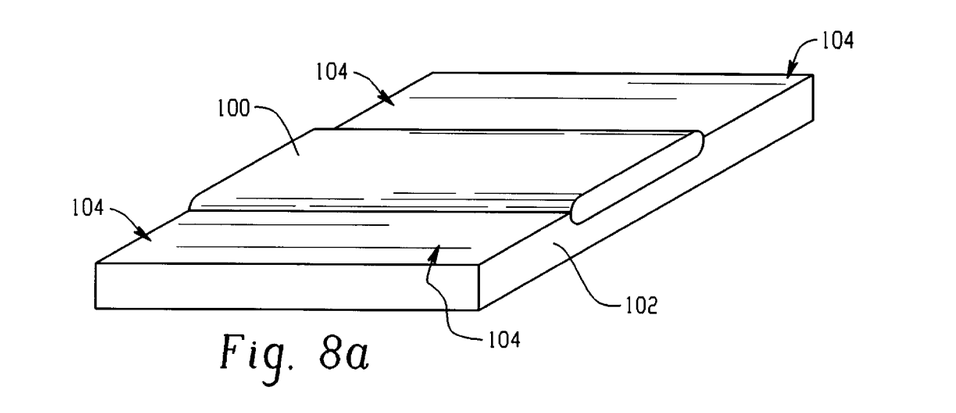
FIGS. 8a–8j are perspective views illustrating a method according to the present invention for forming a flash memory device without poly stringers.

The method according to one aspect of the present invention will be described in conjunction with FIGS. 8a–8j. The manufacture of a flash memory cell according to one exemplary embodiment of the present invention begins with the formation of one or more field oxide regions 100 in a semiconductor substrate 102, as illustrated in FIG. 8a. The field oxide region 100 is conventionally formed by, for example, growing a layer of thermal oxide (also called "barrier oxide" or "pad oxide") over the surface of the substrate 102. A masking layer (not shown), frequently composed of nitride, is deposited on the barrier oxide and patterned to cover regions 104 of the substrate 102 in which memory cells are to be formed. After patterning the masking layer, the field oxide 100 is grown to a thickness of about 6,500 Angstroms in the exposed areas of the thermal oxide by, for example, local oxidation of silicon (LOCOS). The field oxide region 100 will provide electrical isolation between the various active regions 104 in which the memory cells will lie. After growing the field oxide 100, the masking layer and thermal oxide are stripped to expose the underlying substrate 102 in the regions 104, as illustrated in FIG. 8*a*.

Figure 8B:
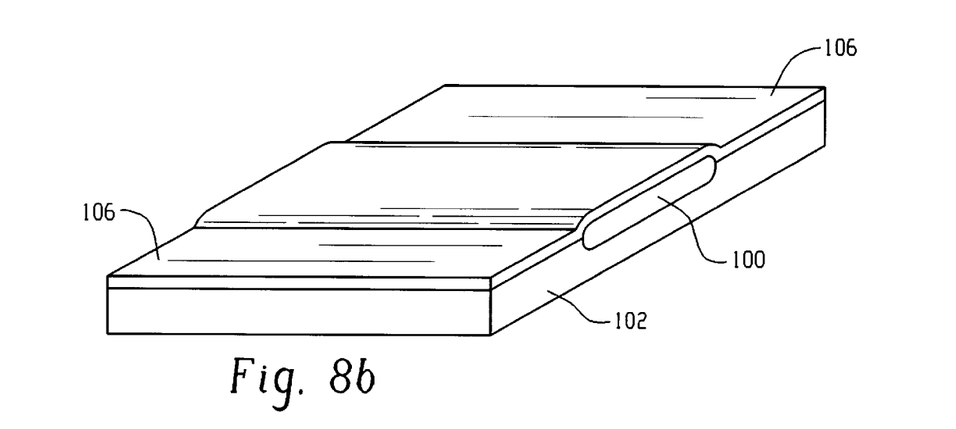

After the formation of the field oxide regions 100, a thin tunnel oxide layer (not shown) is formed over the substrate 102 having a thickness of, for example, about 50–150 Angstroms using a thermal growth process in a dry oxidation furnace. After formation of the tunnel oxide, a first layer of polycrystalline silicon 106 ("polysilicon") having a thickness of about 500–1,000 Angstroms is deposited via, for example, low pressure chemical vapor deposition ("LPCVD") and doped via, for example, diffusion doping or ion implantation doping techniques to make thereby the first polysilicon layer less resistive. The deposited first polysilicon layer 106 is illustrated in FIG. 8*b*. (Note that the tunnel oxide underlies the first polysilicon layer 106, however, due to its relative thinness and for the sake of simplicity, the tunnel oxide layer is not shown in the figures.)

Figure 8C:
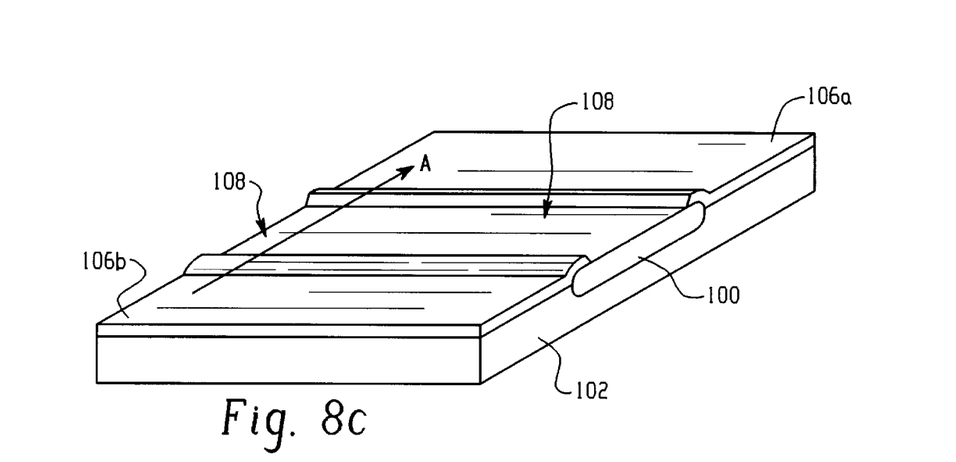

Subsequent to the deposition and doping of the first polysilicon layer 106, the layer 106 is etched to define the memory cells along the length of a single word line, as illustrated in FIG. 8*c*. The layer 106 is etched using a dry etch such as, for example, a reactive ion etching process ("RIE") using a HBr—$O_2$ or a HBr—$Cl_2$—$O_2$ etch chemistry. The etching step removes polysilicon in a region 108 which overlies a substantial portion of the field oxide region 100, thereby separating the polysilicon layer 106 into two or more regions 106*a* and 106*b*, respectively, which are separated from one another by the field oxide region 100. This etch step defines various memory cells along the direction "A", as illustrated in FIG. 8*c*. The direction "A" is the direction in which the word lines (which will be formed later in the process) will extend and wherein each region 106*a* and 106*b* of the first polysilicon layer 106 will form a separate floating gate for a cell along a given word line.

Figure 8D:
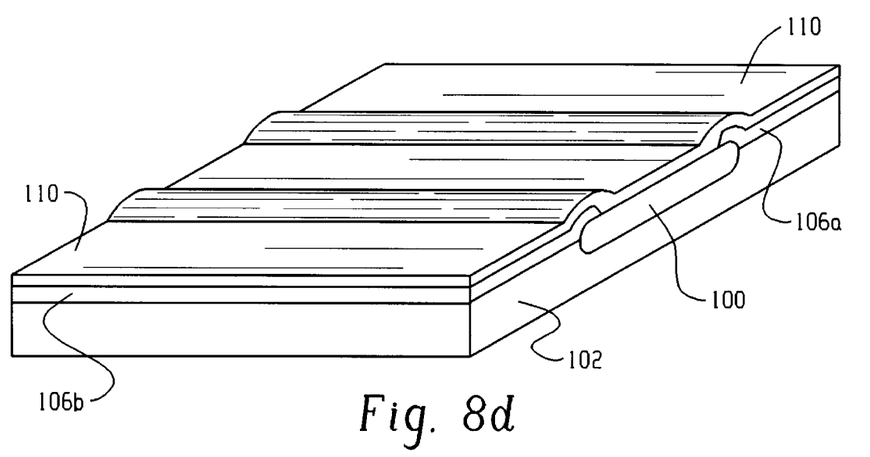

A multi-layer interpoly dielectric 110 is then formed over the surface of the substrate 102, as illustrated in FIG. 8*d*. This layer 110 is often called the interpoly dielectric since (as will be seen shortly) it is sandwiched between the first polysilicon layer 106 (the floating gate for each flash memory cell) and a second polysilicon layer which forms the control gate for each cell as well as the word line interconnect for each of the flash cells associated with a given word line. The interpoly dielectric 110 is preferably a three layer region of oxide/nitride/oxide (also called "ONO") and has a thickness of about 150–400 Angstroms. The ONO layer 110 is formed by repetitive depositions of oxide, nitride and oxide as is well known by those skilled in the art to form a dielectric layer in which the nitride is sandwiched between the two oxide layers. The ONO layer 110 overlies the entire surface of the substrate 102, including the region 108 in which the first polysilicon layer 106 was etched.

Figure 8E:
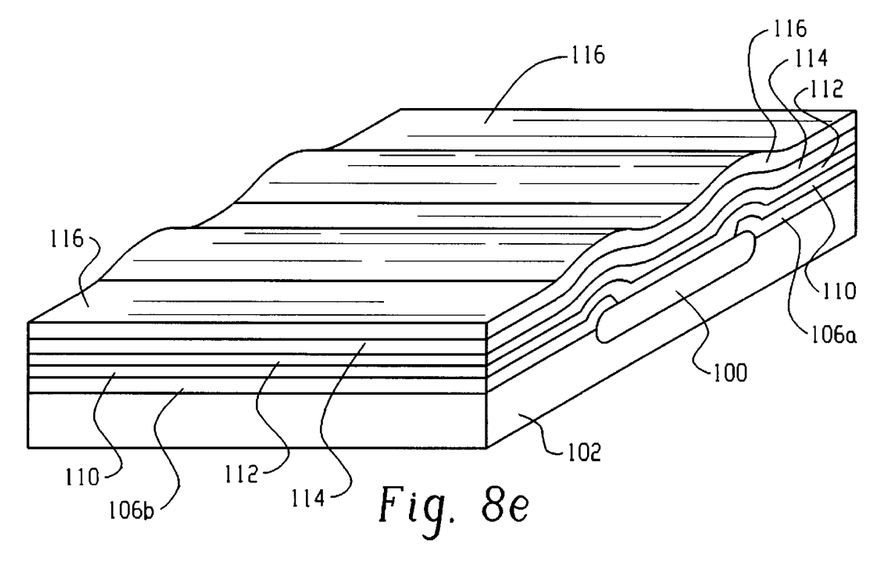

After the formation of the ONO layer 110, the remaining layers, which will complete the stack for each flash memory cell, are formed. These layers include a second polysilicon layer 112, a tungsten silicide layer 114 and a poly-cap layer 116 consisting of an oxynitride, as illustrated in FIG. 8*e*.

The second polysilicon layer 112 is deposited via, for example, LPCVD and will, in conjunction with the tungsten silicide layer 114, form the control gate for each flash cell. The second polysilicon layer 112 is also doped in a manner similar to the first polysilicon layer 106 to lower the resistivity of the region. The tungsten silicide layer 114 is then deposited over the second polysilicon layer 112 via, for example, LPCVD. The silicide layer 114 provides a lower resistance contact for improved flash memory cell performance. The poly-cap layer 116 is about 500 Angstroms thick, is formed via, for example, LPCVD and is used to prevent any potential peeling or cracking of the underlying tungsten silicide 114. A silicon oxynitride layer (not shown) is then deposited over the poly cap layer 116 and provides an anti-reflective coating at masking and also acts as a masking layer for subsequent etching.

Figure 8F:
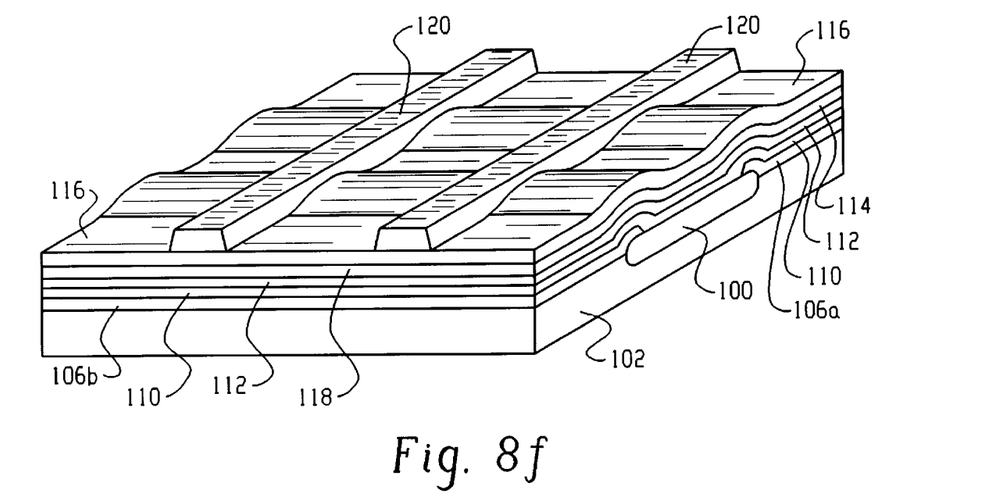

After the second polysilicon layer 112, the tungsten silicide layer 114 and the poly-cap layer 116 of the memory stack structure have been formed, a plurality of word lines for the memory cells are defined by etching, thereby creating stack structures. The etching is achieved by depositing and defining a photoresist masking layer 120 of approximately 1–1.5 microns over the entire surface of the substrate 102, as illustrated in FIG. 8*f*. Subsequently, a number of successive etching steps are performed.

According to one exemplary embodiment of the invention, the etching steps take place in a multi-chamber etch tool wherein the silicon oxynitride is etched with a fluorinated chemistry such as $CHF_3$—$O_2$ in an oxide chamber. The poly cap layer 116 and the tungsten silicide layer 114 are then etched with $SF_6$/HBr (or alternatively, $SF_6$/$Cl_2$ or $Cl_2$—$O_2$) and the second polysilicon layer 112 is etched with HBr—$O_2$ in a poly chamber. The etch steps are preferably formed in an integrated process in which the wafers are not exposed to atmosphere when transferring the wafers from one chamber to another.

Figure 8G:
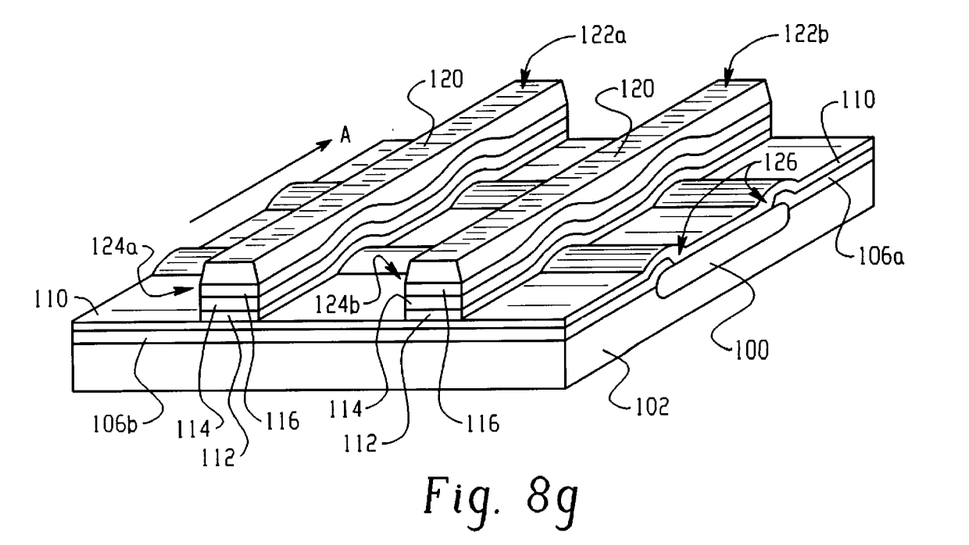

The remaining word lines 122*a* and 122*b* are defined by stack structures 124*a* and 124*b* (after each of the above etch steps is completed), as illustrated in FIG. 8*g*. Note that in this structure the word lines 122*a* and 122*b* are formed in the direction "A" which is transverse to the etching of the first polysilicon layers 106*a* and 106*b*, respectively.

Figure 8H:
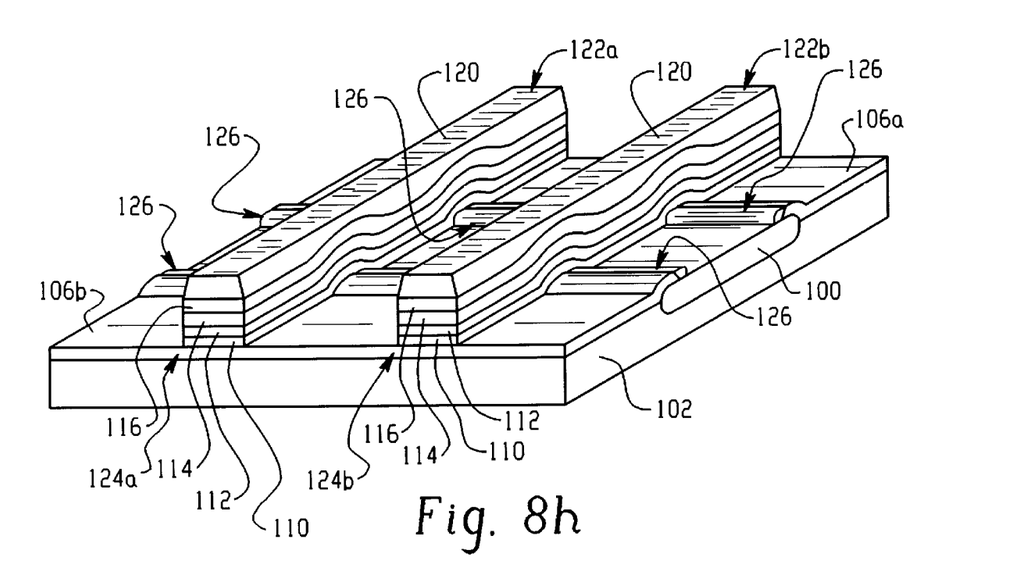

Once the second polysilicon layer 112, the tungsten silicide layer 114 and the poly-cap layer 116 have been removed, a self-align etch ("SAE") is performed to remove the ONO layer 110 and the first polysilicon regions 106*a* and 106*b* in the regions that are not covered by the stack structures 124*a* and 124*b*. The SAE etch is a two step etch process in which the ONO layer 110 is first removed using, for example, a $CF_4$—$O_2$ RIE etch, as illustrated in FIG. 8*h*. Note that most of the surface layer of the ONO layer 110 having a thickness of about 150–400 Angstroms is removed, however, the regions 126 that overlie the steps of the first polysilicon regions 106*a* and 106*b* remain. These regions, which have a greater thickness than the first polysilicon layer, constitute the ONO fence discussed in prior art FIG. 6*a*–6*c*. Note that in FIG. 8*h* the dimensions of the ONO fences 126 are exaggerated for illustration purposes.

Figure 8I:
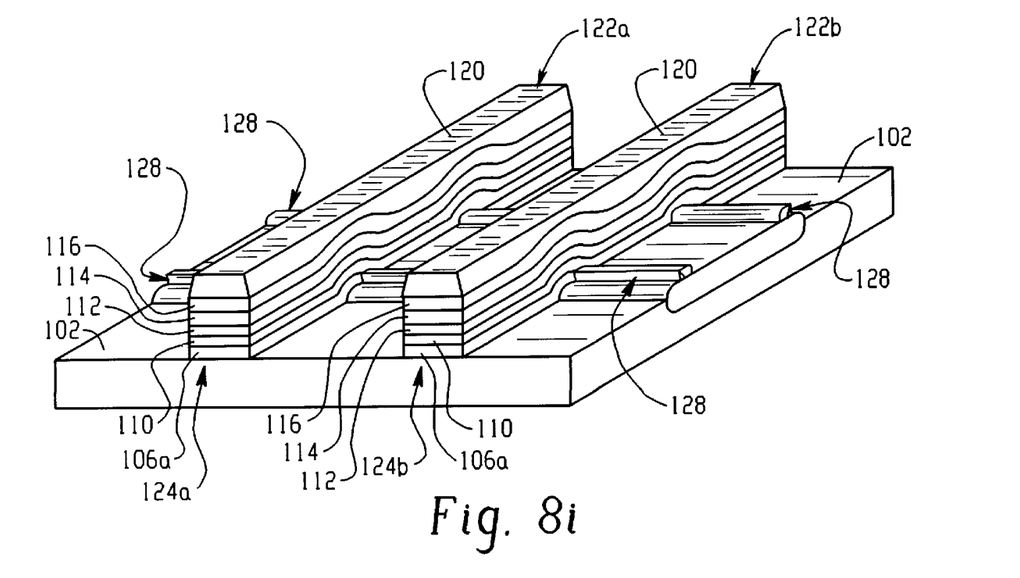

The second phase of the SAE etch is the removal of the exposed polysilicon regions 106*a* and 106*b* to thereby further define the floating gate structures for each respective word line 122*a* and 122*b*. The polysilicon etch includes, for example, an HBr—$O_2$ or a HBr—$Cl_2$—$O_2$ RIE etch chemistry that is highly anisotropic. Since the ONO fences 126 are angled, the fences 126 shield portions of the polysilicon layers 106*a* and 106*b*, thereby leaving remnants 128 of polysilicon material (the poly stringers) behind, as illustrated in FIG. 8*i*. As discussed previously, the poly stringers 128 are remnants of polysilicon left behind following etching due to the shielding of the angled ONO fences 126 due to the non-ideal nature of the earlier polysilicon etch.

Figure 8J:
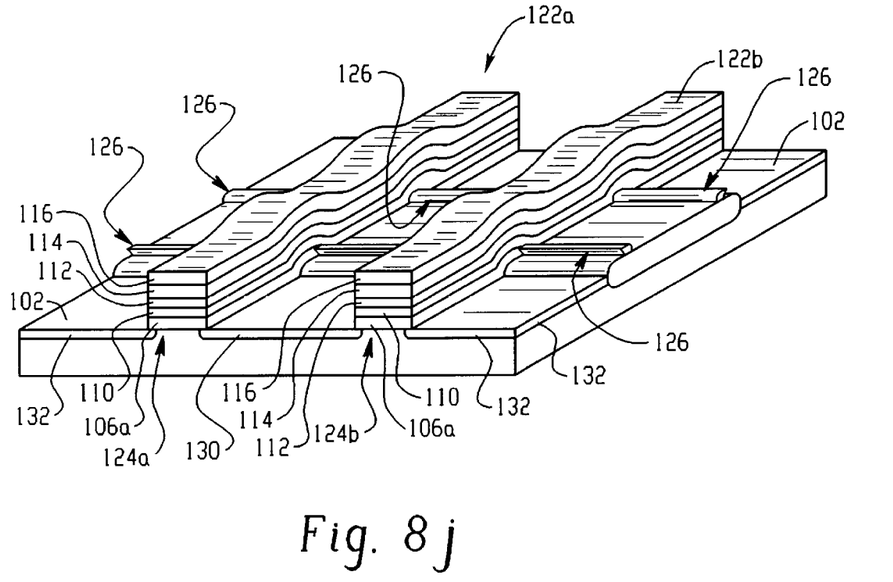

The poly stringers 128 that are produced in the SAE etch of FIGS. 8h and 8i are subsequently removed in a clean-up etch. The clean-up etch is a short isotropic etch that attacks the poly stringers 128 in all directions (that is, both in the vertical and lateral directions), thereby removing them between the word lines 122a and 122b, as illustrated in FIG. 8j. Any type of isotropic etch is contemplated as falling within the scope of the present invention. Preferably, however, a dry isotropic etch which is highly selective to oxide is used such as, for example, $SF_6$ or $CF_4$. In addition, SF6 or CF4 may be used in combination with other gases such as $O_2$ or HBr to provide the desired selectivity to oxide and also prevent the rest of the exposed stack (the poly cap layer 116, the tungsten silicide layer 114 and the ONO layer 110) from being adversely etched. Preferably, the isotropic etch is a short duration etch step so that the floating gates 106a and 106b and the control gates 116 (which are polysilicon) are not substantially affected by the isotropic etch. An exemplary isotropic etch duration is about 10–15 seconds. It is preferred that the isotropic clean-up etch continue only as long as necessary to ensure the removal of the poly stringers 128. In addition to controlling the etch duration to limit any detrimental effects of the isotropic etch, other etch parameters may also be controlled such as, for example, by adjusting the flow rates of the etch chemistries, the chamber pressure, the plasma excitation power, the substrate bias voltage, etc. to ensure removal of the poly stringers without substantially impacting the polysilicon regions in the stack. Each of these variations and their respective combinations are contemplated as falling within the scope of the present invention.

The isotropic clean-up etch provides a substantial improvement in the manufacturability of the process by eliminating the poly stringer problem caused by the angled ONO fences. In addition, the clean-up etch is simple and does not substantially impact the memory cell stack structures 124a and 124b, respectively. The fabrication of the flash memory cells is then completed by forming the source and drain regions 130 and 132, respectively by, for example ion implantation which are illustrated in FIG. 8j. During the formation of the source and drain regions 130 and 132, the stacked gate structures 124a and 124b serve as self-aligning mechanisms. After formation of the source and drain regions 130 and 132, the resist mask 120 is removed. In the above manner, an easy method for forming flash memory cells without poly stringers is provided.

Figure 9:
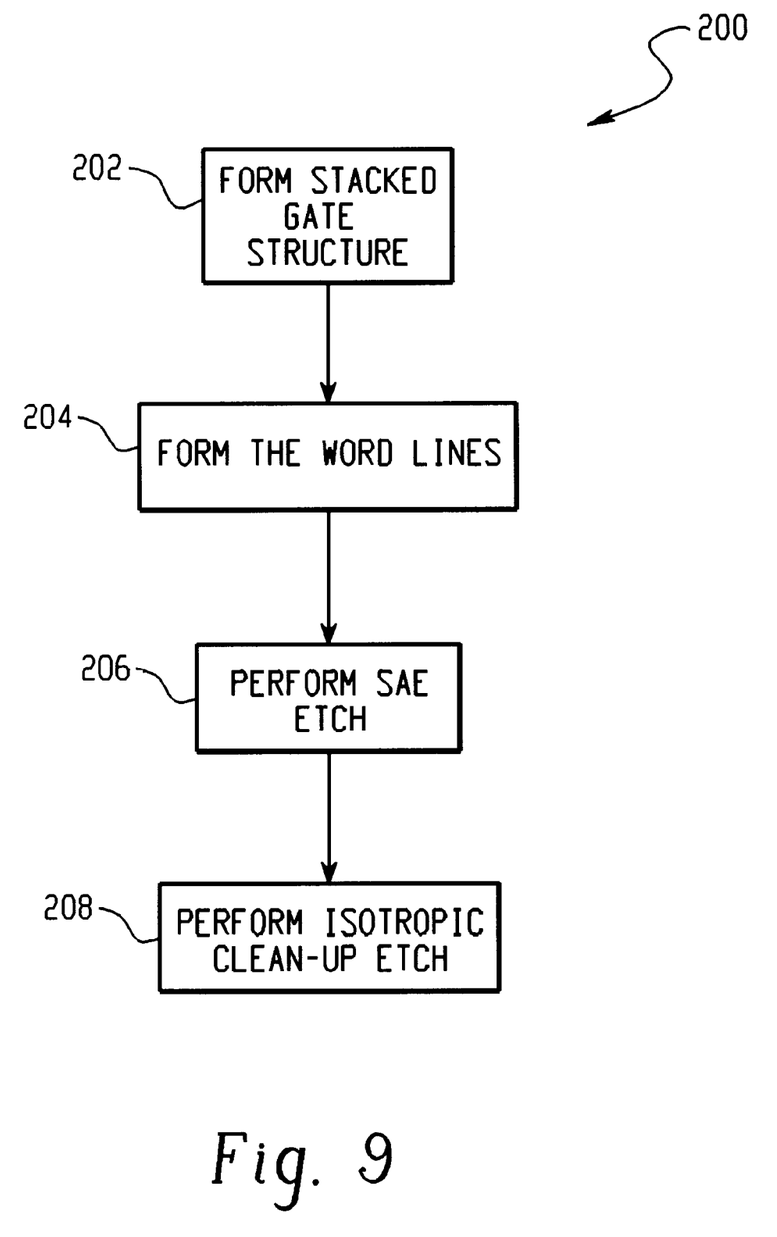
FIG. 9 is a flow chart illustrating manufacturing steps in a method for forming a flash memory without poly stringers in accordance with the embodiment of the present invention exemplified in FIGS. 8a–8j.

Although the present invention has been described in conjunction with a particular set of exemplary processing steps, the method is equally applicable to any semiconductor manufacturing process in which a flash memory device having a stacked gate structure is fabricated. This method is illustrated in the flowchart of FIG. 9. The method 200 includes the step of forming the stacked gate structure at step 202. Any method by which a stacked gate structure may be formed in contemplated as falling within the scope of the present invention. Forming the stacked gate structure 202 includes depositing the layers and etching the floating gate layer to define the various memory cells along a word line. Next, the word lines are formed by delineating one word line from another at step 204. Although this step is preferably accomplished by successive etch steps to remove various stack layers in regions between the desired word lines, any method by which the word lines are formed are contemplated as falling within the scope of the present invention.

After delineating the word lines at step 204, a self-align etch (SAE) process is employed at step 206 to remove the first polysilicon layer and the overlying ONO layer in the regions between the desired word lines. Although a two-step SAE etch is preferably utilized to remove the first polysilicon layer and the ONO layer, any process methodology by which these layers are removed is contemplated by the present invention. The method 200 then continues with the performing of an isotropic clean-up etch to remove any poly stringers that remain after the SAE etch. Subsequent processing is then performed to form the source and drain regions in the substrate as is well known by those skilled in the art.

The present invention discussed the removal of poly stringers caused by the shielding of the first layer of polysilicon by the angled ONO fences when the etching of the first polysilicon layer results in a non-ideal anisotropic etch profile that is less than 90°. Alternatively, however, the present invention is equally applicable to the removal of poly stringers caused by the shielding of the second layer of polysilicon (the control gate layer) by the angled ONO fences when the etching of the first polysilicon results in a non-ideal anisotropic etch profile that is greater than 90°. In that instance, the poly stringers will be remnants from the second polysilicon layer and will exist on the opposite side of ONO fence. In that case, the post-SAE isotropic clean-up etch may also be used to remove the poly stringers, thereby improving the manufacturability of the memory device. Therefore the present invention contemplates removing poly stringers that are either remnants from either the first or second layer of polysilicon.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of eliminating poly stringers in a memory device, comprising the steps of:

forming a stacked gate region on a substrate, the stacked gate region including a polysilicon layer underlying an insulative region;

forming one or more word lines in the stacked gate region;

performing a self-aligned etch of the polysilicon layer and the insulative region in regions adjacent the one or more word lines, whereby one or more poly stringers may form in the regions adjacent the one or more word lines; and performing an isotropic clean-up etch after the self-aligned etch, thereby removing any poly stringers in the regions adjacent the one or more word lines.

2. The method of claim 1, wherein the step of forming the stacked gate region on the substrate comprises the steps of:
  forming a tunnel oxide;
  forming a first conductive region over the tunnel oxide;
  forming an insulative region over the first conductive region; and
  forming a second conductive region over the insulative region.

3. The method of claim 2, further comprising etching the first conductive region to define one or more memory cells within a word line before the forming of the insulative region.

4. The method of claim 2, wherein the step of forming a first conductive region comprises depositing a polycrystalline layer and doping the polycrystalline layer with impurity ions.

5. The method of claim 2, wherein the step of forming the insulative region comprises the steps of:
  forming a first oxide layer;
  forming a nitride layer over the first oxide layer; and
  forming a second oxide layer over the nitride layer.

6. The method of claim 2, wherein the step of forming the second conductive region comprises depositing a polycrystalline layer and doping the polycrystalline layer with impurity ions.

7. The method of claim 6, wherein forming the second conductive region further comprises:
  depositing a metal layer over the polycrystalline layer; and
  performing a thermal treatment, thereby causing the metal layer and the polycrystalline layer to react at an interface of the two layers, thereby forming a silicide.

8. The method of claim 1, wherein forming one or more word lines comprises the steps of etching a conductive layer formed on the stacked gate region into one or more regions, wherein the one or more regions define the one or more word lines.

9. The method of claim 1, wherein the insulative region comprises an interpoly dielectric region and wherein performing a self-aligned etch comprises the steps of:
  etching an interpoly dielectric region in regions adjacent to the one or more word lines, wherein the interpoly dielectric region is partially removed and one or more fences remain; and
  etching the polysilicon layer after etching the interpoly dielectric.

10. The method of claim 1, wherein performing an isotropic clean-up etch comprises the steps of subjecting the memory device to a dry etch.

11. A method of forming a flash memory device, comprising the steps of:
  forming a tunnel oxide on a substrate;
  forming a first conductive layer on the tunnel oxide;
  forming an insulating layer on the first conductive layer;
  forming a second conductive layer on the insulating layer;
  etching the first and second conductive layers and the insulating layer, thereby defining one or more stacked gate structures, whereby one or more conductive remnants may form in regions between the one or more stacked gate structures;
  performing an isotropic clean-up between the stacked gate structures, thereby removing any conductive remnants between the stacked gate structures that remain after the etching of the first and second conductive layers and the insulating layer; and
  forming a source region and a drain region in the substrate, wherein the source region and the drain region are self-aligned by the stacked gate structures, thereby forming one or more memory cells.

12. The method of claim 11, wherein forming the first conductive layer further comprises etching the first conductive layer in a direction transverse to the stacked gate structures, thereby forming one or more memory cells along a word line.

13. The method of claim 11, wherein the second conductive layer is doped polysilicon and the step of forming the second conductive layer further comprises the steps of:
  forming a metal layer over the doped polysilicon;
  converting the metal layer and the doped polysilicon layer into a silicide overlying the doped polysilicon layer; and
  forming a poly-cap layer over the silicide.

14. The method of claim 11, wherein performing the isotropic clean-up etch comprises performing a wet etch.

15. The method of claim 11, wherein performing the isotropic clean-up etch comprises performing a dry etch.

16. The method of claim 15, wherein performing the dry etch comprises performing a plasma etch using $SF_6$.

17. The method of claim 16, wherein performing the dry etch comprises performing a plasma etch using $CF_4$.

* * * * *